US010720574B2

United States Patent
Chan et al.

(10) Patent No.: US 10,720,574 B2
(45) Date of Patent: *Jul. 21, 2020

(54) PHASE CHANGE MEMORY STACK WITH TREATED SIDEWALLS

(71) Applicant: Micron Technology, Inc., Boise, ID (US)

(72) Inventors: Tsz W. Chan, Boise, ID (US); Yongjun Jeff Hu, Boise, ID (US); Swapnil Lengade, Boise, ID (US); Shu Qin, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/266,777

(22) Filed: Feb. 4, 2019

(65) Prior Publication Data

US 2019/0355902 A1  Nov. 21, 2019

Related U.S. Application Data

(60) Division of application No. 15/882,666, filed on Jan. 29, 2018, now Pat. No. 10,224,479, which is a
(Continued)

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *H01L 27/2409* (2013.01); *H01L 27/2427* (2013.01); *H01L 27/2481* (2013.01); *H01L 45/12* (2013.01); *H01L 45/1233* (2013.01); *H01L 45/1253* (2013.01); *H01L 45/141* (2013.01); *H01L 45/144* (2013.01);
(Continued)

(58) Field of Classification Search
None
See application file for complete search history.

(56) References Cited

U.S. PATENT DOCUMENTS 6,143,124 A   11/2000 Ahn
9,281,471 B2   3/2016 Hu et al.
(Continued)

OTHER PUBLICATIONS

Liu, Zheng, et al., "Ultrathin high-temperature oxidation-resistant coatings of hexagonal boron nitride", Nature Communications, 4 (2541), (Oct. 4, 2013), 1-8.
(Continued)

*Primary Examiner* — Mounir S Amer
(74) *Attorney, Agent, or Firm* — Schwegman Lundberg & Woessner, P.A.

(57) ABSTRACT

Memory devices and methods for fabricating memory devices have been disclosed. One such method includes forming the memory stack out of a plurality of elements. An adhesion species is formed on at least one sidewall of the memory stack wherein the adhesion species has a gradient structure that results in the adhesion species intermixing with an element of the memory stack to terminate unsatisfied atomic bonds of the element. The gradient structure further comprises a film of the adhesion species on an outer surface of the at least one sidewall. A dielectric material is implanted into the film of the adhesion species to form a sidewall liner.

20 Claims, 9 Drawing Sheets

Related U.S. Application Data continuation of application No. 15/090,292, filed on Apr. 4, 2016, now Pat. No. 10,079,340, which is a division of application No. 14/266,415, filed on Apr. 30, 2014, now Pat. No. 9,306,159.

(52) U.S. Cl.
CPC ............ *H01L 45/16* (2013.01); *H01L 45/165* (2013.01); *H01L 45/1616* (2013.01); *H01L 45/1675* (2013.01)

(56) References Cited

U.S. PATENT DOCUMENTS

| | | | |
|---|---|---|---|
| 9,306,159 | B2 | 4/2016 | Chan et al. |
| 9,673,256 | B2 | 6/2017 | Hu et al. |
| 10,079,340 | B2 | 9/2018 | Chan et al. |
| 10,177,198 | B2 | 1/2019 | Hu et al. |
| 10,224,479 | B2 | 3/2019 | Chan et al. |
| 10,325,653 | B2 | 6/2019 | Hu et al. |
| 10,381,072 | B2 | 8/2019 | Hu et al. |
| 10,546,895 | B2 | 1/2020 | Hu et al. |
| 2011/0049465 | A1 | 3/2011 | Nagashima |
| 2012/0224413 | A1 | 9/2012 | Zhang et al. |
| 2012/0241705 | A1 | 9/2012 | Bresolin et al. |
| 2013/0128649 | A1 | 5/2013 | Quick et al. |
| 2015/0123066 | A1 | 5/2015 | Gealy et al. |
| 2015/0318038 | A1 | 11/2015 | Hu et al. |
| 2015/0318467 | A1 | 11/2015 | Hu et al. |
| 2015/0318468 | A1 | 11/2015 | Chan et al. |
| 2016/0190209 | A1 | 6/2016 | Hu et al. |
| 2016/0218282 | A1 | 7/2016 | Chan et al. |
| 2017/0358629 | A1 | 12/2017 | Hu et al. |
| 2018/0144795 | A1 | 5/2018 | Hu et al. |
| 2018/0166629 | A1 | 6/2018 | Chan et al. |
| 2019/0140023 | A1 | 5/2019 | Hu et al. |
| 2019/0362785 | A1 | 11/2019 | Hu et al. |

OTHER PUBLICATIONS

U.S. Appl. No. 16/417,320, filed May 20, 2019, Variable Resistance Memory Stack With Treated Sidewalls.

U.S. Appl. No. 14/266,365, filed Apr. 30, 2014, Phase Change Memory Stack With Treated Sidewalls, U.S. Pat. No. 9,281,471.

U.S. Appl. No. 15/063,179, filed Mar. 7, 2016, Phase Change Memory Stack With Treated Sidewalls, U.S. Pat. No. 9,673,256.

U.S. Appl. No. 15/090,292, filed Apr. 4, 2016, Phase Change Memory Stack With Treated Sidewalls, U.S. Pat. No. 10,079,340.

U.S. Appl. No. 15/882,666, filed Jan. 29, 2018, Phase Change Memory Stack With Treated Sidewalls.

U.S. Appl. No. 14/266,456, filed Apr. 30, 2014, Phase Change Memory Stack With Treated Sidewalls.

U.S. Appl. No. 15/856,806, filed Dec. 28, 2017, Variable Resistance Memory Stack With Treated Sidewalls.

US 10,720,574 B2

PHASE CHANGE MEMORY STACK WITH TREATED SIDEWALLS

PRIORITY APPLICATION

This application is a divisional of U.S. application Ser. No. 15/882,666, filed Jan. 29, 2018, now issued as U.S. Pat. No. 10,224,479, which is a continuation of U.S. application Ser. No. 15/090,292, filed Apr. 4, 2016, now issued as U.S. Pat. No. 10,079,340, which is a divisional of U.S. application Ser. No. 14/266,415, filed Apr. 30, 2014, now issued as U.S. Pat. No. 9,306,159, all of which are incorporated herein by reference in their entireties.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are important elements of integrated circuits due to their ability to maintain data absent a power supply. Phase change materials have been investigated for use in non-volatile memory cells. Phase change memory (PCM) elements include phase change materials, such as chalcogenide alloys, that are capable of stably transitioning between amorphous and crystalline phases. Each phase exhibits a particular resistance state and the resistance states distinguish the logic values of the memory element. Specifically, an amorphous state exhibits a relatively high resistance and a crystalline state exhibits a relatively low resistance. One of different logic levels (e.g., logic 1 or logic 0) can be assigned to each of these states.

There are general needs to improve PCM devices.

DETAILED DESCRIPTION

As described subsequently, a method for fabricating a memory stack (e.g., memory device) with treated sidewalls can increase the adhesion of dielectric passivation material to the electrodes. This can reduce inter-diffusion between the electrodes and adjacent materials in the memory stack.

Figure 1:
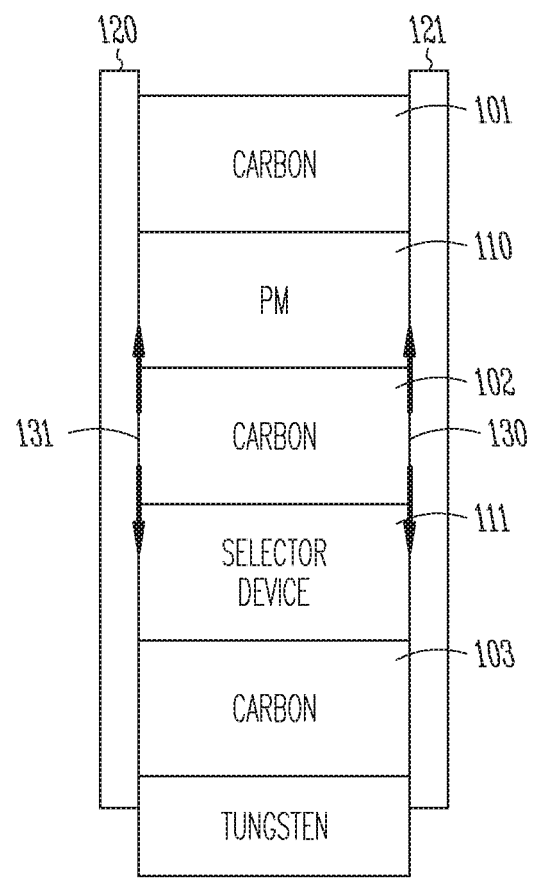
FIG. 1 illustrates a cross-sectional view of a typical phase change memory stack.

FIG. 1 illustrates a typical memory cell stack for a PCM. Carbon can be used as top 101, middle 102, and bottom 103 electrodes for the memory cell stack. Carbon is chemically inert and does not react easily with the phase change material 110 or the selector device material 111. This inert chemistry can also lead to poor adhesion of sidewalls to the carbon electrodes. As a result, it can be possible for the sidewall material 120, 121 to inter-diffuse 130, 131 between the selector device material 111 and the phase change material 110. This can occur at higher local temperatures during device operation. The inter-diffusion can cause reliability issues, degrade leakage current, and affect threshold voltage stability.

FIGS. 2-7 illustrate various steps in fabricating a memory stack (e.g., PCM) in addition to treating the sidewalls of the memory stack with an adhesion species. These fabrication steps are for purposes of illustration only as the different elements of the stack can be formed by different processes.

Figure 2:
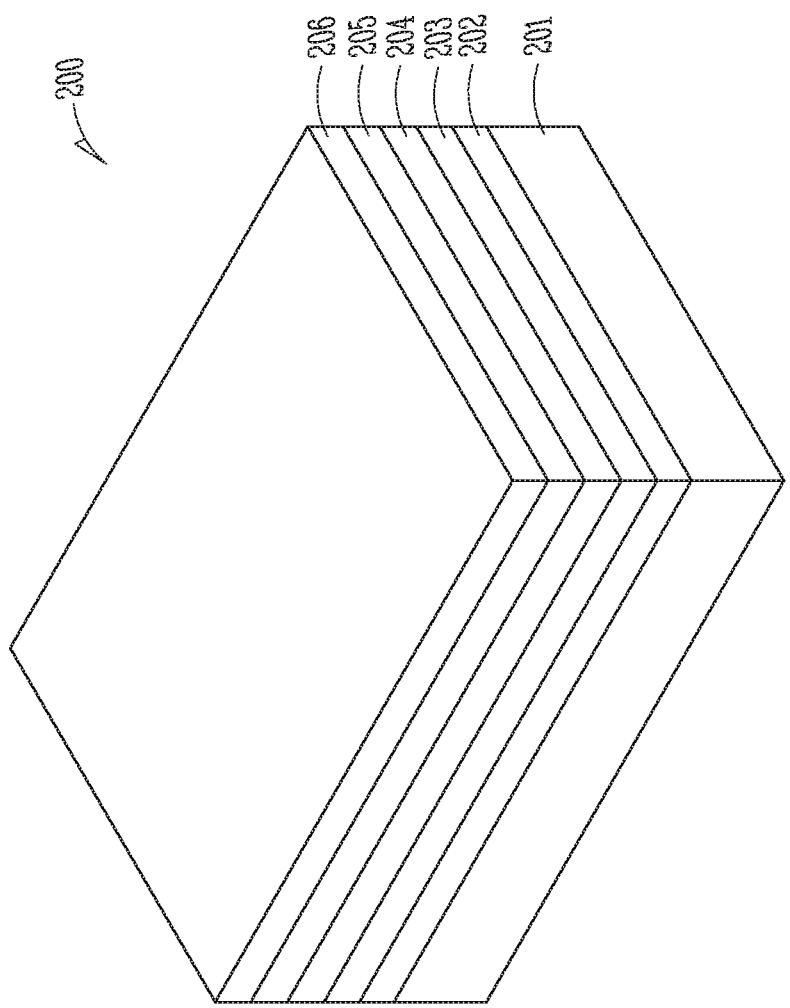
FIGS. 2-7 illustrate an embodiment of a process flow to fabricate a phase change memory stack having treated sidewalls.

FIG. 2 illustrates an embodiment of a blanket deposition of the initial memory stack material 200. The memory stack can include a word line material (e.g., tungsten (W)) 201. A first electrode material 202 (e.g., carbon) can be formed on the word line material 201. A selector device material 203 may be formed on the first electrode material 202.

The selector device material 203 (SD) may include Selenium (Se), Arsenic (As), Germanium (Ge), Tin (Sn), Tellurium (Te), Silicon (Si), Lead (Pb), Carbon (C), or Bismuth (Bi) as well as other materials. Other embodiments can include selector device material 203 comprising one or more of these elements as well as one or more of these elements combined with other elements.

A second electrode material 204 (e.g., carbon) can be formed on the selector device material 203. A phase change material 205 can be formed on the second electrode material 204.

The phase change material 205 (PM) can include chalcogenide elements such as Germanium (Ge), Antimony (Sb), Tellurium (Te), Indium (In) as well as other chalcogenide elements, combinations of these elements, or combinations of these elements with other elements. The phase change material 205 can additionally include Aluminum (Al), Gallium (Ga). Tin (Sn), Bismuth (Bi), Sulphur (S), Oxygen (O), Gold (Au), Palladium (Pd), Copper (Cu), Cobalt (Co), Silver (Ag), or Platinum (Pt) as well as other elements. Additional embodiments can combine these elements with the chalcogenide elements.

A third electrode material 206 (e.g., carbon) can be formed on the phase change material 205. Forming the third electrode material 206, as well as the other materials 201-205 of the memory stack, can be done with a blanket deposition method or some other deposition method.

Figure 3:
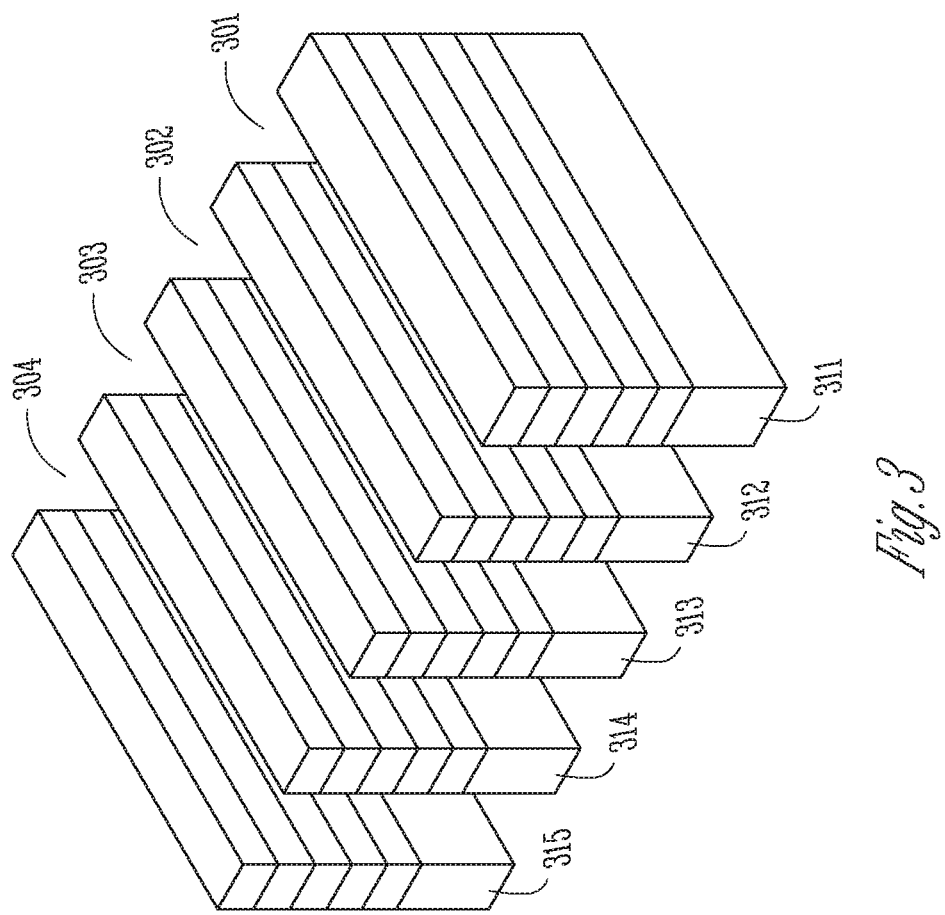

After the initial memory stack material 200 has been formed, an etch process (e.g., dry etch) can be performed on the stack material 200 to create trenches 301-304 as illustrated in FIG. 3. FIG. 3 illustrates that the stack material 200 has been divided by the plurality of trenches 301-304 into a plurality of memory stacks 311-315, each stack comprising the architecture illustrated in FIG. 2.

Figure 7:
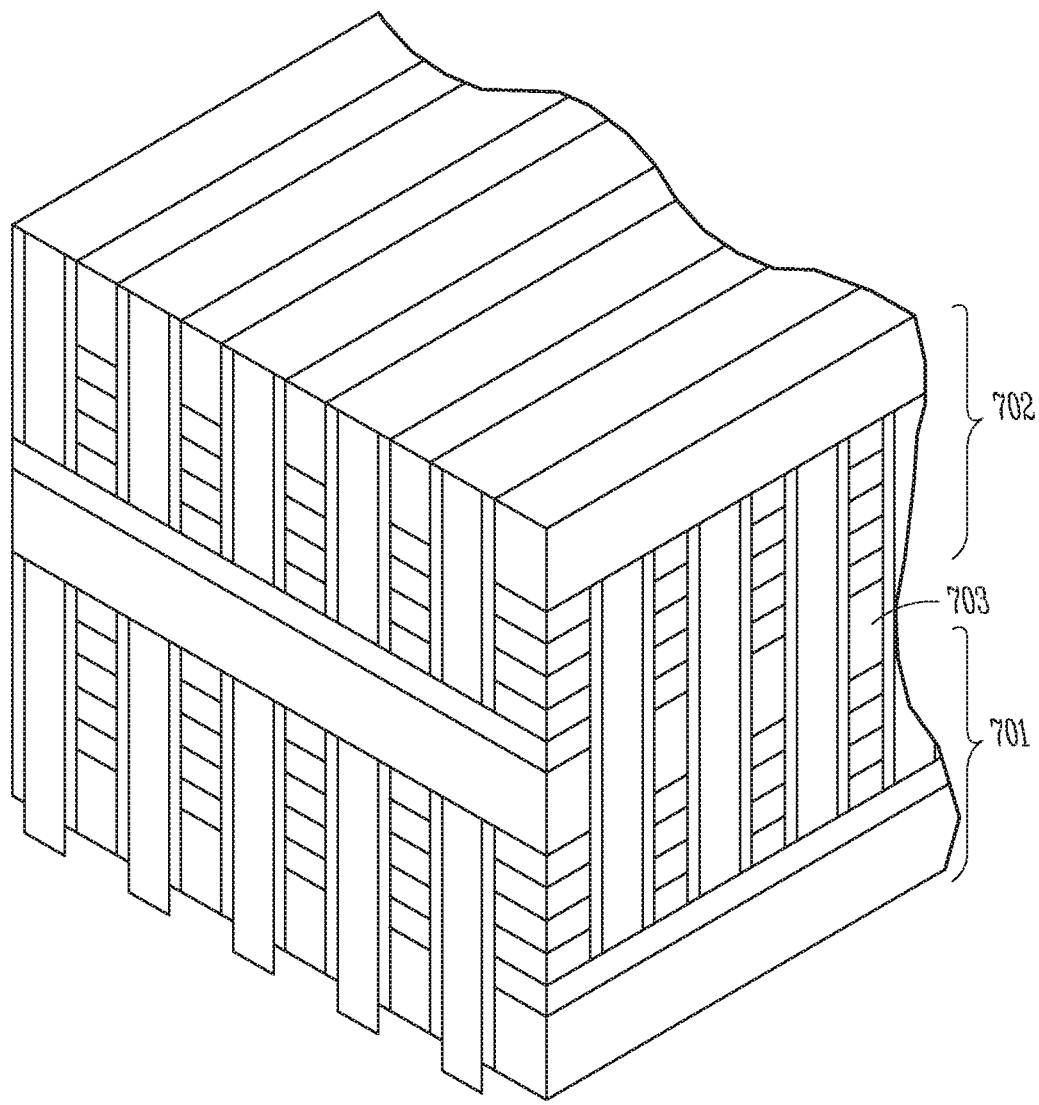

In another embodiment, the stack material 200 can be dry etched patterned in both x and y directions. Thus, subsequent sidewall liners can be added on four sidewalls, as illustrated in FIG. 7.

Figure 4:
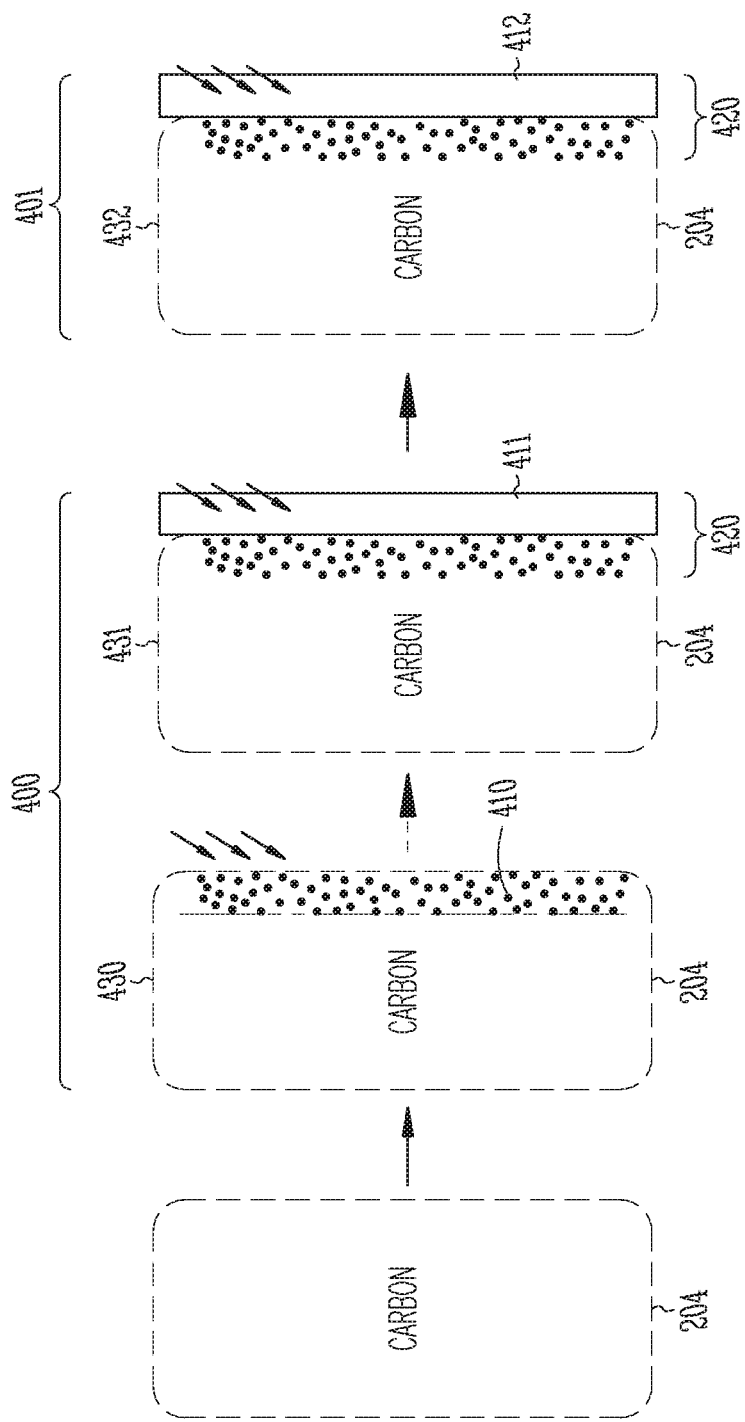

FIG. 4 illustrates the treatment of the sidewalls of particular ones of the stack 311-315 as formed in FIG. 3. This treatment enhances the dielectric liner adhesion to the electrode surfaces. In an embodiment, a plasma immersion technique (e.g., plasma doping) can be used to implant an adhesion species in the stack sidewalls and deposit a dielectric liner (e.g., nitride). While FIG. 4 illustrates the treatment process with regard to only one sidewall of one electrode, the sidewalls of the other electrodes can experience a similar process.

The sidewall treatment process illustrated in FIG. 4 includes a step 430 of implanting the sidewall of the carbon electrode(s) 204 with an adhesion species (e.g., boron) using a relatively low energy (e.g., <3 k eV) plasma doping (PLAD) process 400. This can be accomplished by exposing the sidewall to a diborane gas ($B_2H_6$) resulting in a B-C layer 410 as a result of the boron terminating unsatisfied atomic bonds of the carbon.

A subsequent step 431 includes depositing a boron film 411 on the electrode 204. As a result of the PLAD implant/deposition process 400, a gradient structure 420 of B-C bonds and the boron film is formed that can be approximately 1-6 nm thick.

Another step 432 includes implanting a dielectric material (e.g., nitride (N)) into the B-C gradient 420. For example, a relatively low energy (e.g., 0-2 k eV) $NH_3$ or $N_2/H_2$ PLAD process 401 can implant nitrogen atoms into the boron film 411 to form a $BN_X$ film 412 on the carbon electrode 204 sidewall. The $BN_X$ film 412 can be referred to as the sidewall liners or dielectric liners.

The process illustrated in FIG. 4 can result in a dielectric liner 412 that can be a few atomic layers thick. If a thicker $BN_X$ film is desired, the process of FIG. 4 can be repeated.

Relatively low energy plasma immersion implant can have advantages if used in this process. For example, conformal doping can be used in the process in order to achieve a tunable implant/deposition operation regime and a shallow profile. The ion bombardment nature of an implant process can enhance an adhesion-friendly species (e.g., boron) by intermixing with the electrode material. For example, the implanted boron can improve adhesion by species intermixing and terminating unsatisfied atomic bonds (e.g., carbon bonds). Other adhesion species besides boron that have similar properties can also be used. This process can be accomplished at approximately room temperature. To form the PCM cells, electrically insulated pillars are formed (e.g., by dry etching) in the bit line direction while the memory stacks are formed in the word line direction.

Figure 5:
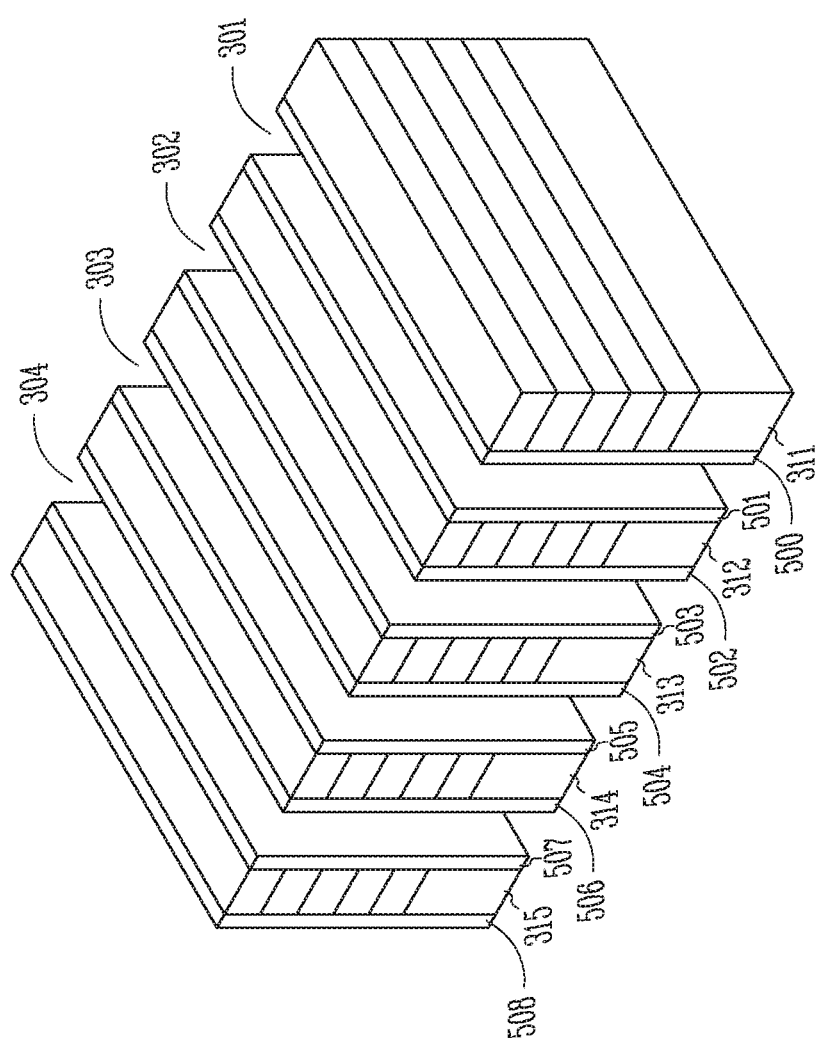

FIG. 5 illustrates the stacks 311-315 as a result of forming the sidewall liners 500-508 on the sidewalls of the stacks 311-315 as seen in FIG. 4. The process to form the sidewall liners 500-508 can use any dielectric material that can be implanted into the adhesive species film 411. For purposes of illustration, a dielectric material like AlSiO, can be used.

Figure 6:
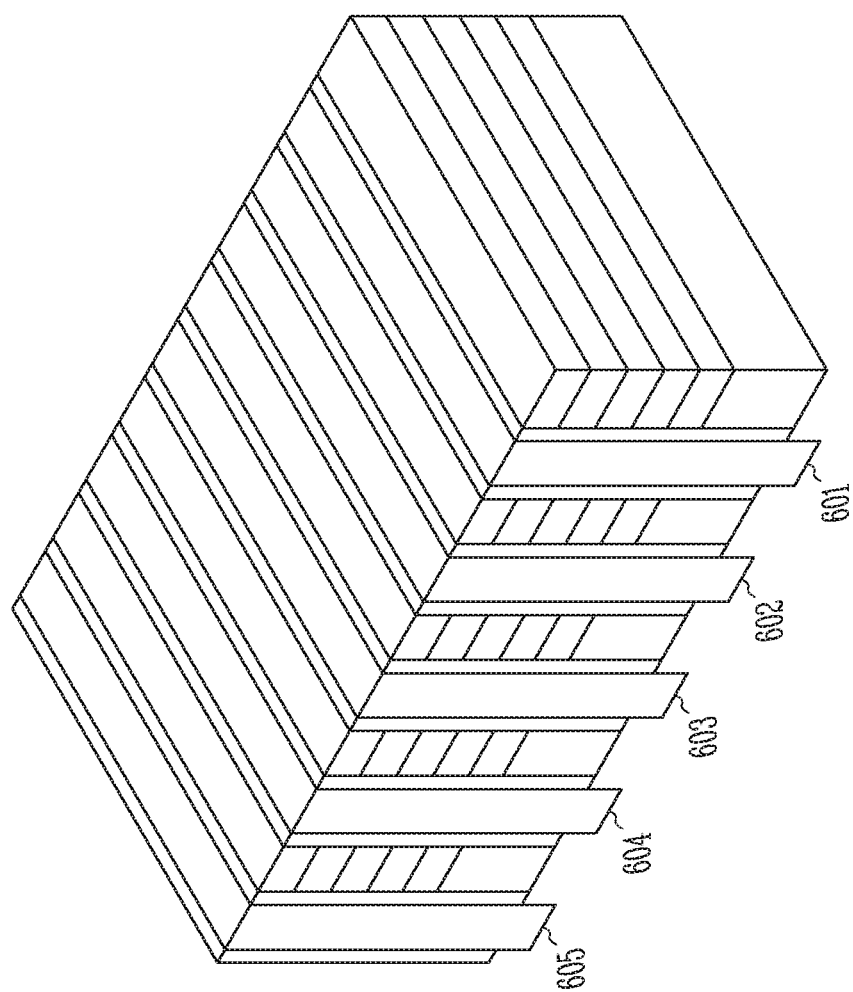

FIG. 6 illustrates an embodiment for forming a dielectric fill material 601-604 between adjacent memory stacks. The dielectric fill material 601-604 can electrically isolate each of the memory stacks. The dielectric fill material 601-604 can be the same material as the sidewall liners 500-508 or a different dielectric material.

FIG. 7 illustrates an embodiment for forming additional decks of memory stacks. For example, FIG. 7 shows two memory stacks 701, 702 coupled together at a common bit line 703. The sidewalls or the sidewall liner treatment described previously with reference to FIG. 4 and below with reference to FIG. 8 may be repeated for the memory stacks at each of the decks. Other embodiments can have additional decks of memory stacks 701, 702. This embodiment can be obtained by a patterned dry etch process in both the x-direction and the y-direction and the liner added to the far side sidewall.

The represented sequence of layers is for purposes of illustration only. Other embodiments can use other sequences. For example, the relative position of the PM and select material (SD) may be exchanged. Also, the relative positions of word line material and bit line material may be changed (e.g., having bit lines at the bottom of the first deck and word lines at the top of the first deck and possibly shared with a second deck stack.

Figure 8:
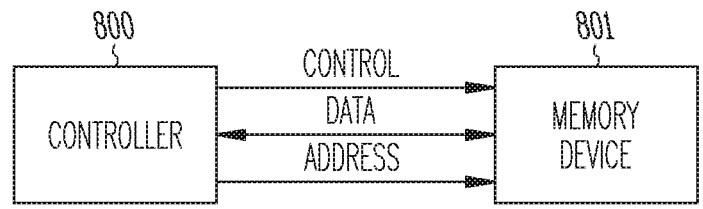
FIG. 8 illustrates a block diagram of a memory system in accordance with the embodiments of FIGS. 2-7.

FIG. 8 illustrates a block diagram of a memory system that include a memory device 801 that can use the memory stacks with treated sidewalls of FIGS. 2-7. A controller 800 may be used to control operations of the system. The memory device 801, coupled to the controller 800, may include a memory array comprising memory cell stacks as described above with reference to FIGS. 2-7.

The controller 800 may be coupled to the memory device 801 over control, data, and address buses. In another embodiment, the address and data buses may share a common input/output (I/O) bus. The controller 800 can be part of the same integrated circuit as the memory device 801 or as separate integrated circuits.

Figure 9:
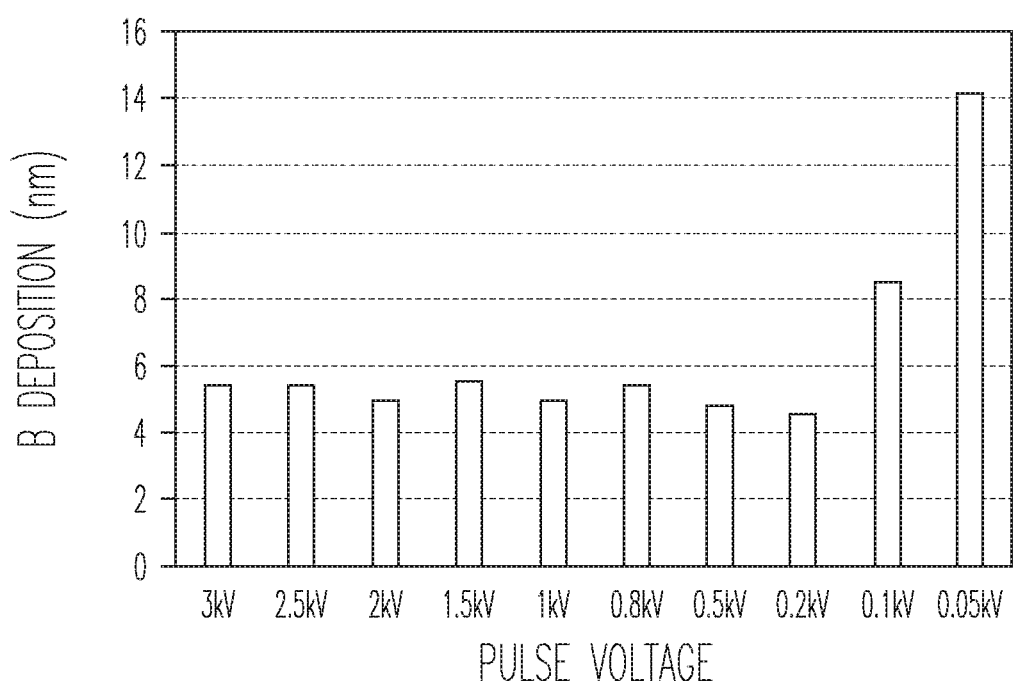
FIG. 9 illustrates a plot of adhesion species deposition depth versus pulse voltage.

FIG. 9 illustrates a plot of adhesion species (e.g., boron) deposition depth (in nanometers) versus pulse voltage. This plot assumes a $B_2H_6/H_2$ PLAD process. The plot shows that the boron deposition layer thickness can be increased at relatively low energy (e.g., <200 eV) and low temperature (e.g., <approximately 390° C.). Implant mode begins to increase at approximately 200V.

Figure 10:
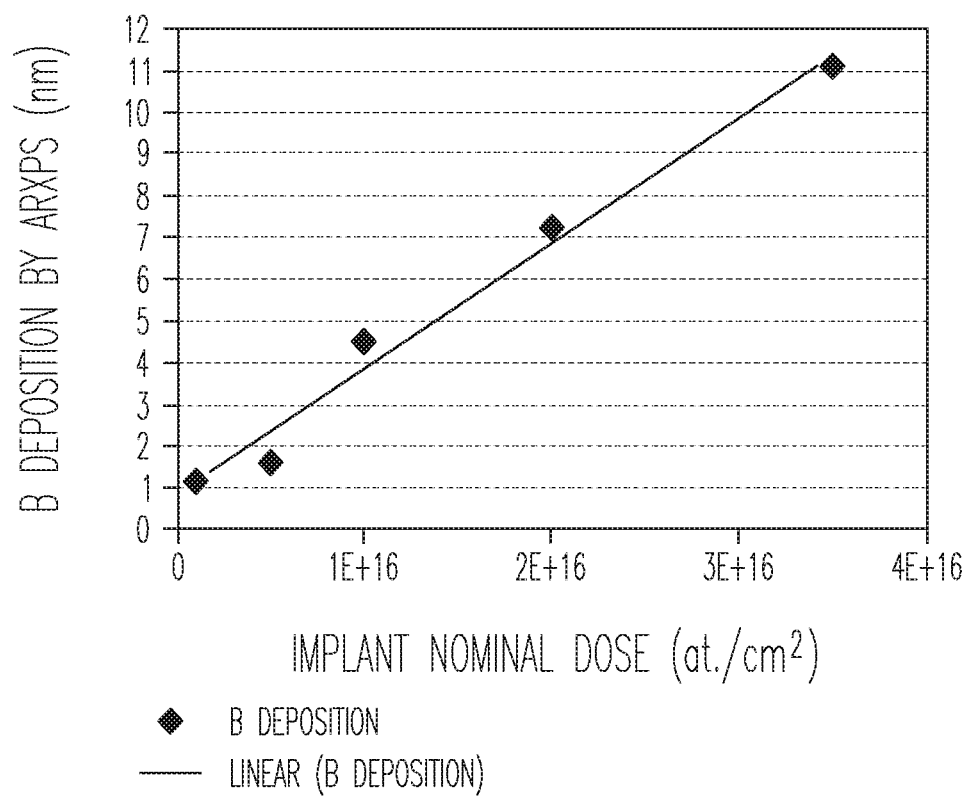
FIG. 10 illustrates a plot of adhesion species deposition depth versus implant nominal dose.

FIG. 10 illustrates a plot of adhesion species (e.g., boron) deposition depth (in nanometers) versus implant nominal dose (in atmospheres/centimeter$^2$). This plot shows that, even for higher energy (e.g., >3 k eV), the implant/deposition intermixing mode can increase the adhesion species deposition thickness with dose.

As used herein, an apparatus may refer to, for example, circuitry, an integrated circuit die, a memory device, a memory array, or a system including such a circuit, die, device or array.

CONCLUSION

One or more embodiments of the method for memory stack sidewall treatment can result in a memory device with memory stacks having enhanced adhesion to the sidewall liners. For example, an adhesion species (e.g., boron) can intermix with particular materials of the memory stack to create better adhesion and, thus, reduced sidewall material inter-diffusion. The adhesion species can be implanted in the sidewalls using a PLAD implant/deposition process to form a gradient of boron film and an atomic intermixed structure of boron and carbon. A dielectric forming material (e.g., N) can then be implanted into the film to form a $BN_X$ sidewall liner.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A memory structure, comprising:
   multiple memory stacks comprising respective vertically stacked structures, including,
   a first electrode, and
   a variable resistance material comprising a chalcogenide material, the variable resistance material disposed to a first side of the first electrode in the vertically stacked structures of the memory stack,
   wherein at least the first electrode has a sidewall surface doped with an adhesion species that intermixes with the material of the first electrode; and a film comprising the material of the adhesion species formed over at least the doped sidewall surface of the first electrode.

2. The memory structure of claim 1, wherein the first electrode comprises carbon, and wherein the adhesion species comprises boron.

3. The memory structure of claim 1, further comprising a dielectric material liner implanted into the adhesion species film.

4. The memory structure of claim 3, wherein the adhesion species comprises boron and the implanted dielectric material liner comprises boron and nitride (BNX).

5. The memory structure of claim 3, wherein the variable resistance material comprises one or more of Germanium (Ge), Antimony (Sb), Tellurium (Te), Indium (In), Aluminum (Al), Gallium (Ga), Tin (Sn), Bismuth (Bi), Sulphur (5), Oxygen (O), Gold (Au), Palladium (Pd), Copper (Cu), Cobalt (Co), Silver (Ag), and/or Platinum (Pt).

6. The memory structure of claim 1, wherein the memory stack further comprises a selector device disposed to the first side of the first electrode in the vertically stacked structures, the selector device located between the first electrode and the variable resistance material.

7. The memory structure of claim 6, further comprising a second electrode disposed to the opposite side of the variable resistance material from the first electrode in the vertically stacked structures of the memory stack.

8. The memory structure of claim 6, further comprising a second electrode disposed to the opposite side of the selector device from the first electrode in the vertically stacked structures of the memory stack.

9. The memory structure of claim 6, further comprising:
a second electrode disposed to the opposite side of the variable resistance material from the first electrode in the vertically stacked structures of the memory stack, and
a third electrode between the selector device and the variable resistance material in the vertically stacked structures of the memory stack; and
wherein at least one of the second and third electrodes includes a respective sidewall surface doped with the adhesion species that intermixes with the material of the at least one of the second and third electrodes.

10. The memory structure of claim 9, wherein at least one of the first, second, and third electrodes comprises carbon, and wherein the at least one electrode of the first, second, and third electrodes comprising carbon includes a respective sidewall surface doped with the adhesion species that interacts with the carbon of the electrode.

11. The memory structure of claim 1, wherein the first electrode is conductively coupled to a word line.

12. A memory device, comprising:
multiple memory stacks, the memory stacks defined by respective sidewalls, and having vertically stacked structures, including,
a first electrode comprising carbon, and
a variable resistance material on a first side of the first electrode;
wherein at least the first electrode has a sidewall surface doped with an adhesion species that intermixes with the carbon of the first electrode, and
a film comprising the material of the adhesion species formed over at least one sidewall of the memory stack.

13. The memory device of claim 12, wherein the adhesion species comprises boron.

14. The memory device of claim 12, further comprising a dielectric material implanted into the adhesion species film; and wherein the implanted dielectric material forms a liner on a sidewall of the memory stack.

15. The memory device of claim 14, wherein the adhesion species comprises boron and wherein the implanted dielectric material liner comprises boron and nitride (BNX).

16. The memory device of claim 14, further comprising selector device material within the memory stacks, wherein the selector device material comprises one or more of Selenium (Se), Arsenic (As), Germanium (Ge), Tin (Sn), Tellurium (Te), Silicon (Si), Lead (Pb), Carbon (C), and/or Bismuth (Bi).

17. The memory device of claim 16, wherein the selector device material is located between the first electrode and the variable resistance material in respective memory stacks.

18. The memory device of claim 17, further comprising:
a second electrode disposed to the opposite side of the variable resistance material from the first electrode in the vertically stacked structures of the memory stack, and
a third electrode between the selector device and the variable resistance material in the vertically stacked structures of the memory stack; and
wherein at least one of the second and third electrodes comprises carbon and includes a respective sidewall surface doped with the adhesion species that interacts with the carbon of the electrode.

19. The memory device of claim 14, further comprising a second electrode disposed to the opposite side of the variable resistance material from the first electrode.

20. The memory device of claim 12, further comprising a dielectric fill material between adjacent memory stacks.

* * * * *